US007458011B2

(12) United States Patent
Nefedov

(10) Patent No.: US 7,458,011 B2
(45) Date of Patent: Nov. 25, 2008

(54) LOW COMPLEXITY HYBRID ARQ SCHEME BASED ON RATE COMPATIBLE ZIGZAG CODES

(75) Inventor: Nikolai Nefedov, Thalwil (CH)

(73) Assignee: Nokia Corporation, Espoo (FI)

( * ) Notice: Subject to any disclaimer, the term of this patent is extended or adjusted under 35 U.S.C. 154(b) by 488 days.

(21) Appl. No.: 11/350,977

(22) Filed: Feb. 8, 2006

(65) Prior Publication Data
US 2006/0179401 A1  Aug. 10, 2006

Related U.S. Application Data

(60) Provisional application No. 60/651,719, filed on Feb. 9, 2005.

(51) Int. Cl.
*G06F 11/00* (2006.01)
(52) U.S. Cl. ..................... 714/800; 714/790
(58) Field of Classification Search .............. 714/6, 714/792, 755, 758, 800, 790; 358/409; 375/240.13; 705/1
See application file for complete search history.

(56) References Cited

U.S. PATENT DOCUMENTS

| | | | | |
|---|---|---|---|---|
| 5,271,012 | A * | 12/1993 | Blaum et al. ..................... 714/6 |
| 5,847,840 | A * | 12/1998 | Enari .......................... 358/409 |
| 6,023,783 | A * | 2/2000 | Divsalar et al. ............. 714/792 |
| 6,408,029 | B1 * | 6/2002 | McVeigh et al. ........ 375/240.13 |
| 7,085,986 | B2 * | 8/2006 | Nefedov ..................... 714/755 |
| 7,249,307 | B2 * | 7/2007 | Varshney et al. ............ 714/758 |
| 2004/0123215 | A1 * | 6/2004 | Nefedov ..................... 714/755 |
| 2006/0190271 | A1 * | 8/2006 | Kim et al. ....................... 705/1 |
| 2006/0190801 | A1 * | 8/2006 | Shin et al. .................... 714/758 |

OTHER PUBLICATIONS

Chan, K. S. et al., "Adaptive Type II Hybrid ARQ Scheme Using Zigzag Code", Electronics Letters, IEE Stevenage, GB, Nov. 25, 1999, ISSN 0013-5194, vol. 35, No. 24, pp. 2102-2104, the whole document.
Nefedov, N., "Evaluation of Low Complexity Concatenated Codes for High Data Rate Transmission", Personal, Indoor and Mobile Radio Communications, 2003. PIMRC 2003. 14$^{th}$ IEEE Proceedings on Sep. 7-10, 2003, Piscataway, NJ, USA, IEEE, Sep. 7, 2003, ISBN 0-7803-7822-9, pp. 1868-1872, Section III, abstract.

(Continued)

*Primary Examiner*—David Ton
(74) *Attorney, Agent, or Firm*—Harrington & Smith PC

(57) ABSTRACT

A channel coding method, apparatus and computer program product that provides efficient hybrid automatic repeat request (HARQ) comprising low complexity rate compatible zigzag codes, and by further applying data reshaping in combination with rate matching rules to substantially avoid sub-optimality due to puncturing, in combination with irregular parallel concatenation of zigzag (PCZZ) codes. Presently preferred rate matching rules comprise: (1) maintaining a PCZZ parameter $\Delta J$ as small as possible; and (2) creating a code having the shortest rows; where a code with $J=1$ gives the lowest coding rate (mother code) with PCZZ parameters (K, 1, 3). Data reshaping shapes K information bits into a plurality of arrays by associating a parity bit with each row of an array. Each array of the plurality has a different number of rows as compared to each other array in order to match rates. Row length within an array may be allowed to vary $\Delta J$ within constraints in order to exactly match a data rate.

39 Claims, 11 Drawing Sheets

OTHER PUBLICATIONS

Nikolai Nefedov and Jari Salo, "Performance of Low Complexity Concatenated Codes Formed by Differential Encoders", IEEE Int Conf on Telecomm., pp. 151-155, Beijing, Jun. 2002.

Timo Lunttila, Sassan Iraji and Heikki Berg, "Advanced Coding Schemes for a Multiband OFDM Ultrawideband System towards 1 Gbps" IEEE Proc. CCNC 2006, Las Vegas, Jan. 2006.

Li Ping, Xiaoling Huang and Nam Phamdo, "Zigzag Codes and Concatenated Zigzag Codes", IEEE Transactions on Information Theory, vol. 47, No. 2, Feb. 2001, pp. 800-807.

Giuseppe Caire, Giorgio Taricco and Gerard Battail, "Weight Distribution and Performance of the Iterated Product of Single-Parity-Check Codes", 1994 IEEE Globecom, pp. 206-211.

* cited by examiner

LOW COMPLEXITY HYBRID ARQ SCHEME BASED ON RATE COMPATIBLE ZIGZAG CODES

CROSS REFERENCE TO RELATED APPLICATION

This application claims priority to U.S. Provisional patent application Ser. No. 60/651,719, filed on Feb. 9, 2005. The contents of that provisional application are hereby incorporated by reference.

TECHNICAL FIELD

This invention relates generally to wireless communications systems and method and, more specifically, relates to signal coders, methods and computer program products.

BACKGROUND

The general methods of error control in data communication links are forward error correction (FEC), overlaying an automatic repeat request (ARQ) scheme, or using a combination of both, which is referred to as hybrid-ARQ (HARQ). In both ARQ and HARQ the presence of errors is detected by using an error detecting code.

A common technique to change data rates in communication systems is by the use of puncturing. In this technique some number of parity symbols, which are formed by a mother code, are not transmitted. Before decoding at the receiver a proper number of known symbols (zeros) are inserted at the locations of the punctured symbols, and then a decoder for the unpunctured mother code is used. Note that puncturing is a suboptimal technique resulting in a performance loss. In the case of convolutional codes this loss can be made negligible by an optimization of puncturing masks.

Rate compatible codes were first proposed for convolutional codes by J. Hagenauer. al, "The performance of rate-compatible punctured convolutional codes for future digital mobile radio" in Proc. IEEE Vehicular Technology Conference 1988, pp. 22-29, Jun. 1988. In that case the punctured convolutional codes were organized in such a way that all coded symbols of higher coding rate are used for decoding lower rate codes. This concept was later extended to rate compatible turbo codes (RCTC) accepted for the Third Generation Partnership Project (3GPP) standardization.

Recently introduced concatenated zigzag codes (see L. Ping, X. Huang and N. Phamdo, "Zigzag Codes and Concatenated Zigzag Codes", IEEE Trans. Information Theory, vol. 47, pp. 800-807, February 2001) are shown to provide comparable or improved (at high coding rates) performance to turbo codes. At the same time the decoding complexity of concatenated zigzag codes is about 10 times less, and it may be reduced even further as suggested by the present inventor in commonly assigned US Patent Publications US 2004/0123215 A1, Jun. 24, 2004 "Low Decoding Complexity Concatenated Codes for High Rate Coded Transmission" and US 2004/0123216 A1, "Low Complexity Decoding Schemes for Single-Parity-Check (SPC) Based Concatenated Codes", Jun. 24, 2004, incorporated by reference herein, as well as in N. Nefedov, "Multi-Dimensional Zigzag Codes for High Data Rate Transmission", Int. Symp. on Turbo Codes and its Applications (ISTCA2003), Brest, France, September 2003.

On the other hand, since parallel concatenation of zigzag (PCZZ) codes inherit some structural properties of block codes, the construction is made more complicated for compatible coding rates required for HARQ (although similar problem can be observed for LDPC codes, which may be presented as a generalization of zigzag codes). One technique to provide different data rates for link adaptation is the use of data reshaping, as is addressed in US 2004/0123215 A1 and in commonly assigned U.S. Patent application Ser. No. 10/971,681, "Flexible Rate and Punctured Zigzag Codes", by Prabodh Varshney et al. Also, multi-dimensional zigzag codes for HARQ schemes are proposed in US 2004/0123215 A1.

SUMMARY OF THE INVENTION

The foregoing and other problems are overcome, and other advantages are realized, in accordance with the presently preferred embodiments of these teachings.

Aspects of this invention enable a channel coding method, apparatus and computer program product that provides efficient hybrid automatic repeat request (HARQ) comprising low complexity rate compatible zigzag codes, and by further applying data reshaping in combination with rate matching rules to substantially avoid sub-optimality due to puncturing, in combination with parallel concatenation of irregular zigzag (irregular PCZZ) codes. Presently preferred rate matching rules include (a) create a PCZZ code having the shortest rows; in particular, a code with J=1 gives the lowest coding rate (mother code) with PCZZ parameters (K, 1, 3);

(b) apply puncturing for parity bits according to virtual data reshaping rules to obtain a desirable coding rate, where virtual reshaping means that parity bits are punctured in such a way that data layers in the resulting code may be presented as rectangular arrays.

(c) A case when data at different data layers are reshaped differently corresponds to irregular PCZZ. Properly constructed irregular PCZZ provides improved performance and flexibility in adjusting coding rates than the standard PCZZ.

(d) In specific cases of certain coding rates and coding block lengths, when exact reshaping is not possible, some irregularity may be allowed within data layers. This irregularity is characterized by parameter $\Delta J$ and is preferably maintained as small as possible.

More particularly, one embodiment of the invention is a method for encoding a series of information bits. In the method, a parity bit set is determined for each of a plurality of first transmission data layers. Each parity bit set includes at least one bit. Each first transmission data layer represents K information bits interleaved in a different manner as compared to other first transmission data layers, and the K information bits in each first transmission data layer form a matrix. Further in the method, the K information bits are encoded with the parity bit set from each first transmission data layer into a first transmission block, which is transmitted to an intended recipient. Responsive to a repeat request from the intended recipient, the method continues as follows. An additional set of parity bits is determined for at least one second transmission data layer. The at least one second transmission data layer represents the K information bits formed into a matrix of dimensions other than those represented by matrices of the first transmission data layers. The additional set of parity bits are transmitted to the intended recipient. As will be detailed, the first transmission data layers may be of the same dimensions or different, and multiple second transmission data layers may be of same or different dimensions.

In another embodiment is a transmitter that includes a data source for providing a series of K information bits, first and second interleavers, first and second zigzag encoders, a memory, a processor, and a transmit antenna. The first interleaver has an input coupled to an output of the data source, and is for interleaving the series of K information bits according to a first interleaving pattern to yield a first interleaved set of bits. The second interleaver is in parallel with the first and has an input coupled to an output of the data source, and is for interleaving the series of K information bits according to a second interleaving pattern to yield a second interleaved set of bits. The first zigzag encoder, having an input coupled to an output of the first interleaver, is for puncturing the first interleaved set of bits with a first set of parity bits from a mother code such that the first set of parity bits shapes the first interleaved set of bits into a first data layer matrix. The second zigzag encoder, having an input coupled to an output of the second interleaver, for puncturing the second interleaved set of bits with a second set of parity bits from the mother code such that the second set of parity bits shapes the second interleaved set of bits into a second data layer matrix. The memory is for storing the mother code. The processor couples the memory to the first and second zigzag encoders, and is for controlling the zigzag encoders. The processor further operates to cause the first zigzag encoder to puncture a repeated first interleaved set of bits with a third set of parity bits from the mother code such that the third set of parity bits shapes the repeated first interleaved set of bits into a third data layer matrix that has dimensions different from either the first or second data layer matrix. The term repeated first interleaved set refers the identical data but not the same pass of that data through the interleaver. The transmit antenna is for wirelessly sending the K information bits and the first and second sets of parity bits in a block, and also for transmitting the third set of parity bits.

Another embodiment of the invention includes a program of machine-readable instructions, tangibly embodied on an information bearing medium and executable by a digital data processor, to perform actions directed toward encoding a series of information bits. The actions include determining a parity bit set for each of a plurality of a first set of data layers. Each parity bit set includes at least one bit, and each data layer of the first set of data layers represents K information bits interleaved in a different manner as compared to others of the first set of data layers. Further, each of the first set of data layers forms a matrix of the K information bits. The actions further determine an additional set of parity bits for at least one second data layer that represents the K information bits formed in a matrix of dimensions other than those represented by matrices of the first set of data layers.

In another embodiment is a receiver that includes an antenna for receiving an encoded signal that includes both information bits and parity bits, first and second zigzag encoders, first and second de-interleavers, first and second comparators, a processor and a memory. The first zigzag decoder has an input coupled to an output of the antenna for de-puncturing a first set of parity bits from the encoded signal according to a first puncturing parameter, wherein the first set of parity bits shapes the information bits into a first array of dimensions I×J. The first comparator has an input coupled to an output of the first zigzag decoder for checking parity of each of the I rows of the first array against a parity bit of the first set. The first de-interleaver has an input coupled to an output of the first zigzag decoder for de-interleaving the information bits that are output from the first zigzag decoder. The second zigzag decoder, which is in parallel with the first zigzag decoder and has an input coupled to an output of the antenna, is for de-puncturing a second set of parity bits from the encoded signal according to a second puncturing parameter, wherein the second set shapes the information bits into a second array of dimensions A×$J_x$. A is an integer greater than I. The second comparator has an input coupled to an output of the second zigzag decoder for checking parity of each of the A rows of the second array against a parity bit of the second set. The second de-interleaver has an input coupled to an output of the second zigzag decoder for de-interleaving the information bits that are output from the second zigzag decoder. The memory is for storing a zigzag mother code, wherein the first and second sets of parity bits are each subsets of the mother code. And the processor is coupled to the first and second zigzag decoders and to the memory for providing those first and second puncturing parameters to the respective first and second zigzag decoders.

In another embodiment, a transmitter includes means for storing a zigzag mother code, means for predetermining a preferred data rate, and means for shaping K information bits into a plurality of arrays by determining a parity bit for each row of each array. In the shaping, each array of the plurality defines a number of rows different than each other array and the total number of parity bits encodes the K information bits at substantially the preferred data rate. The means for storing may be a computer readable storage medium. The means for predetermining a preferred data rate may include a receiver for receiving an automatic repeat request message that carries information about the preferred data rate. The means for shaping may be a first interleaver in series with a first zigzag encoder, a second interleaver in series with a second zigzag encoder, and a processor coupled to each zigzag encoder for applying a data-shaping algorithm for shaping the K information bits into the plurality of arrays. The data-shaping algorithm may allow some constrained variance in row length in one or more array to precisely match the preferred data rate.

These embodiments are detailed further below.

BRIEF DESCRIPTION OF THE DRAWINGS

The foregoing and other aspects of these teachings are made more evident in the following Detailed Description, when read in conjunction with the attached Figures.

DETAILED DESCRIPTION

High data rate coded transmissions, such as those proposed for advanced wireless communications systems (e.g., the so-called 3.9 Generation) require the use of efficient channel coding schemes suitable for packet data transmission. An aspect of this invention is an efficient HARQ scheme based on low complexity rate compatible zigzag codes. In particular, this aspect of the invention employs data reshaping in combination with rate matching rules that are substantially free from sub-optimality due to puncturing. A further aspect of this invention is the use of irregular PCZZ codes that enable an improvement in performance of the PCZZ under the same rate matching framework.

By way of introduction, in accordance with the definition of zigzag codes proposed in L. Ping, X. Huang and N. Phamdo, "Zigzag Codes and Concatenated Zigzag Codes", IEEE Trans. Information Theory, vol. 47, pp. 800-807, February 2001, K information binary bits are arranged into an I×J array, D={d(i, j)} and parity check bit p(i) associated with each $i^{th}$ row are computed recursively using the following equation:

$$p(i)=p(i-1)+\Sigma^J_{j=1} d(i,j), i=2,3,\ldots,I,$$

where p(1)=0 and all summations are modulo 2.

Figure 1:
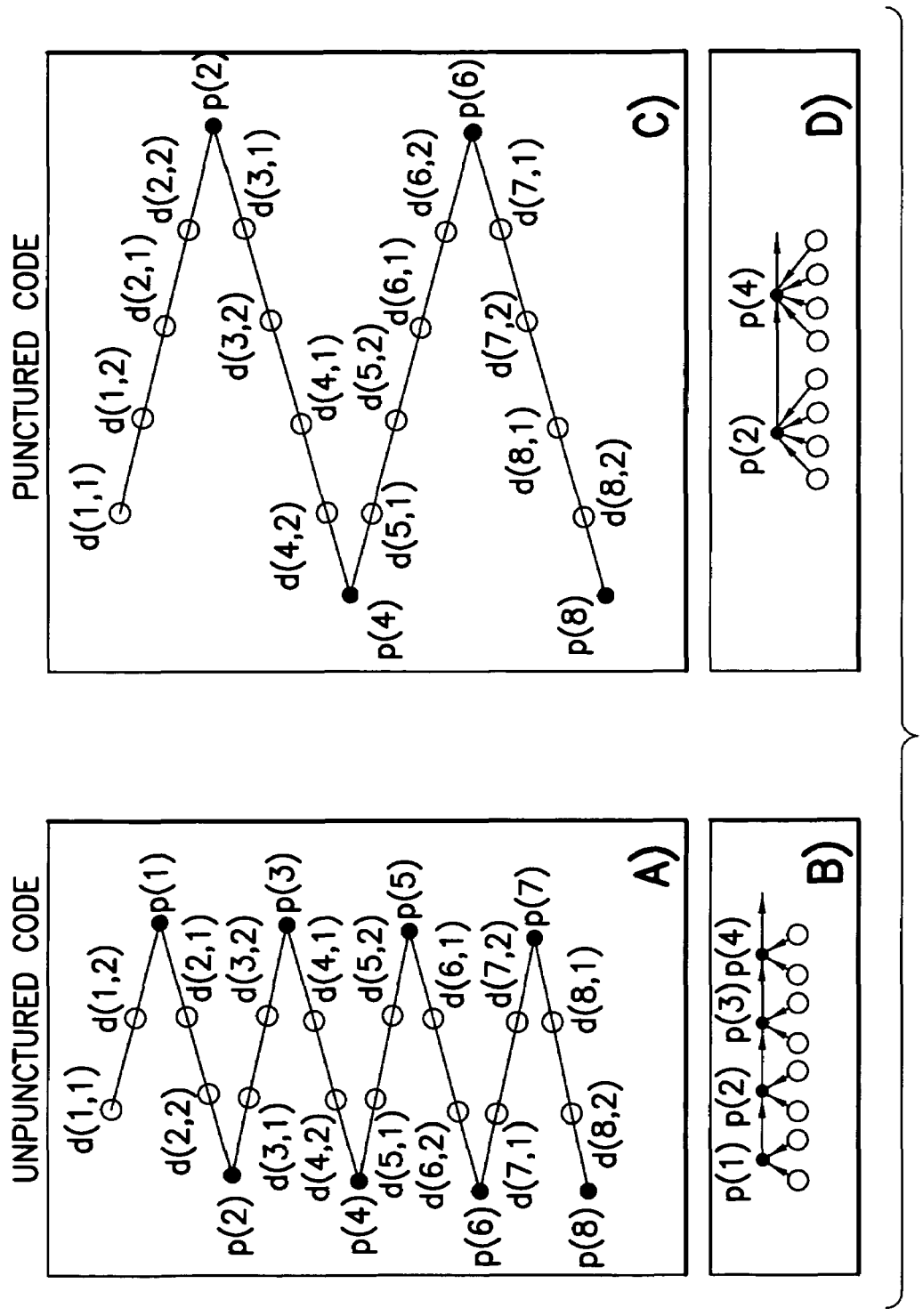
FIG. 1 shows a graphical presentation of a zigzag code with a conventional unpunctured PCZZ (FIGS. 1A, 1B) and punctured PCZZ with a data reshaping rule in accordance with an aspect of this invention (FIGS. 1C, 1D).

A graphical presentation of a zigzag code is shown at FIG. 1A, where white and filled nodes represent information and parity bits, respectively. Zigzag codes are classified as weak codes, and a more powerful code may be built by PCZZ codes, in the same way as in standard turbo codes. In this case the data array D is interleaved by M interleavers to form $D_M$ data arrays with $P_M$ parity check columns. Finally, rate J/(J+M) codewords are formed as (D, $P_1, P_2, \ldots P_M$) (see FIG. 2).

Omitting interleaver parameters, the PCZZ may be described by the parameter triplet (I, J, M). As was shown in the above-referenced commonly assigned US Patent Publications, and in the Nefedov publication, for a Quality of Service (QoS) typically accepted in packet data transmission, the PCZZ3 with two interleavers (M=3) provides the best performance over PCZZ codes.

Figure 3:
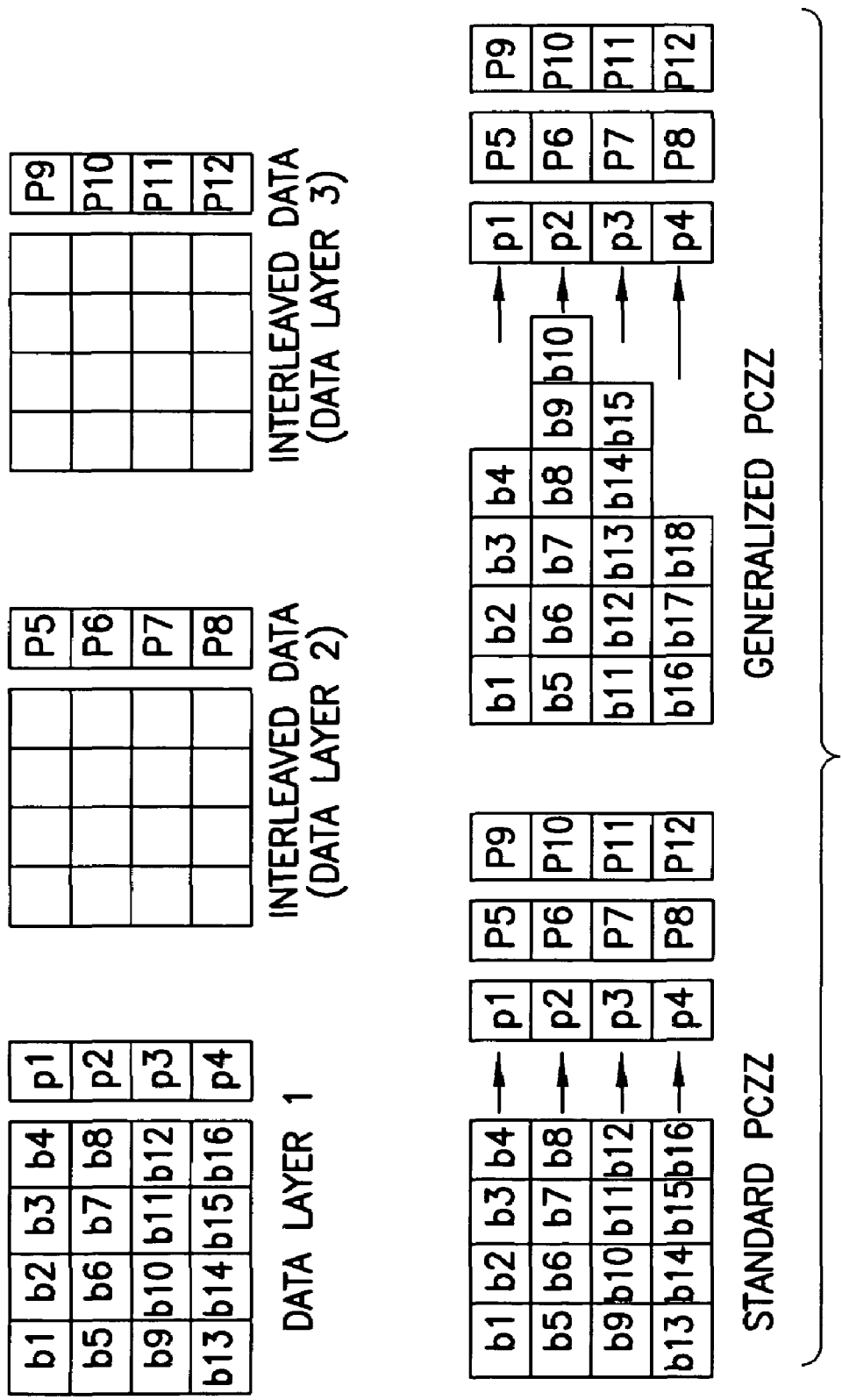
FIG. 3 shows a standard PCZZ and a flexible rate PCZZ.

With regard to generalized PCZZ, in the standard (regular) PCZZ the dimensions for all interleaved data layers and parity vectors are maintained constant (see FIG. 3, the upper row). With M=3 fixed there is only one parameter J to adjust the PCZZ coding rate R=J/(J+M), and for a given input data block length this limits possible coding rates.

Figure 4:
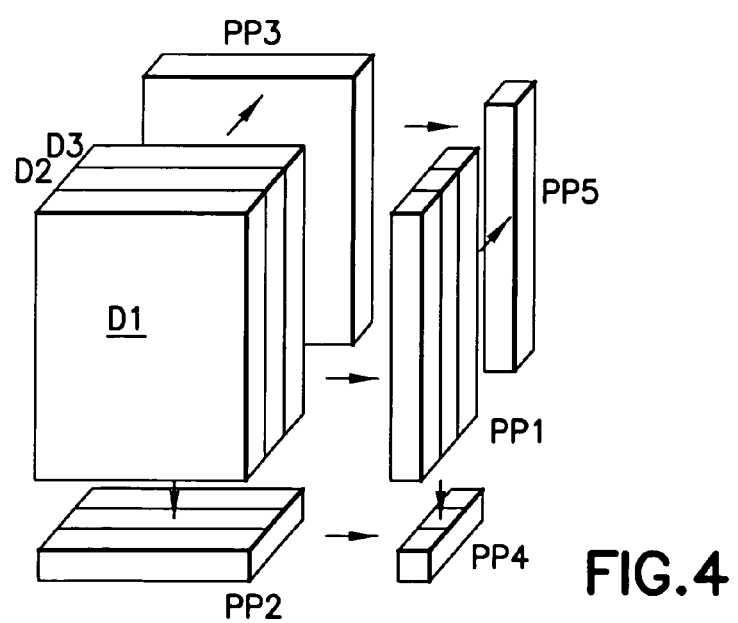
FIG. 4. illustrates multi-dimensional zigzag codes [0123215].

In an attempt to improve flexibility and performance while reducing complexity, several generalizations have been suggested in the above referenced US Patent Publications, the Nefedov publication and in the commonly assigned US Patent Application of Varshney et al. More specifically, what is suggested is a multi-dimensional PCZZ (see FIG. 4), together with a modified decoder and a simple stopping rule to extend applicable coding rates for HARQ, improved convergence of iterative decoding and even further (by a factor of about five to six) reduced decoding complexity.

Another class of generalized PCZZ, flexible rate PCZZ (FR_PCZZ), is proposed in the commonly assigned US Patent Application of Varshney et al. The FR_PCZZ introduces a type of "irregularity", such that lengths of rows $J_i(i=1, \ldots I)$ forming a parity bit p(i) may vary synchronously in all data layers (see FIG. 3, the lower row). This approach allows for more flexibility to adjust coding rates by changing parameters $J_i(i=1, \ldots I)$ simultaneously for all data layers, resulting in a coding rate:

$$R = \frac{\sum_{i=1}^{I} J_i}{IM + \sum_{i=1}^{I} J_i}.$$

However, this type of irregularity has been found to create PCZZ codes with less optimum error correcting properties, which can result in a performance degradation. This degradation may be explained as follows. In FP_PCZZ with different $J_i$ values, data in long rows are less protected than in short rows, hence more decoding errors arise from long rows than from short rows. As the term:

$$\Delta J = \max_i(J_i) - \min_i(J_i)$$

becomes larger, the performance is more dominated by decoding errors from long rows.

Aspects of this invention arise out of the foregoing observations. It has been found that to achieve the best performance the following two principles should be followed:

(1) maintain $\Delta J$ as small as possible (the case of $\Delta J=0$ corresponds to regular PCZZ); and (2) create a code with the shortest rows; a code with J=1 gives the lowest coding rate (mother code) with PCZZ parameters (K, 1, 3).

Based on these principles and certain properties of the Max Log APP (MLA) decoder for PCZZ, aspects of the invention involve deriving design rules for rate matching and provide a PCZZ-based HARQ. Further, a different type of irregularity in PCZZ is introduced that improves performance under the same rate matching framework.

PCZZ-based HARQ

Firstly, from principles above it follows that it is preferable to adjust coding rates with puncturing that is equivalent to virtual data reshaping. This approach is demonstrated at FIGS. 1C and 1D and in FIG. 5. In particular, FIGS. 1A and 1B present a PCZZ code with (I=8, J=2, M=1) and a coding rate R=⅔. If all odd parity bits of FIGS. 1A and 1B are punctured, the resulting code is shown in FIGS. 1C and 1D, which corresponds to another PCZZ (I=8, J=4, M=1) with coding rate R=⅘. It can be appreciated that in this case there is no loss due to puncturing. Using principle (1) above to create a "mother code", and consequently repeating the puncturing (reshaping) method above one obtains the PCZZ-based HARQ in accordance with embodiments of this invention.

Figure 5:
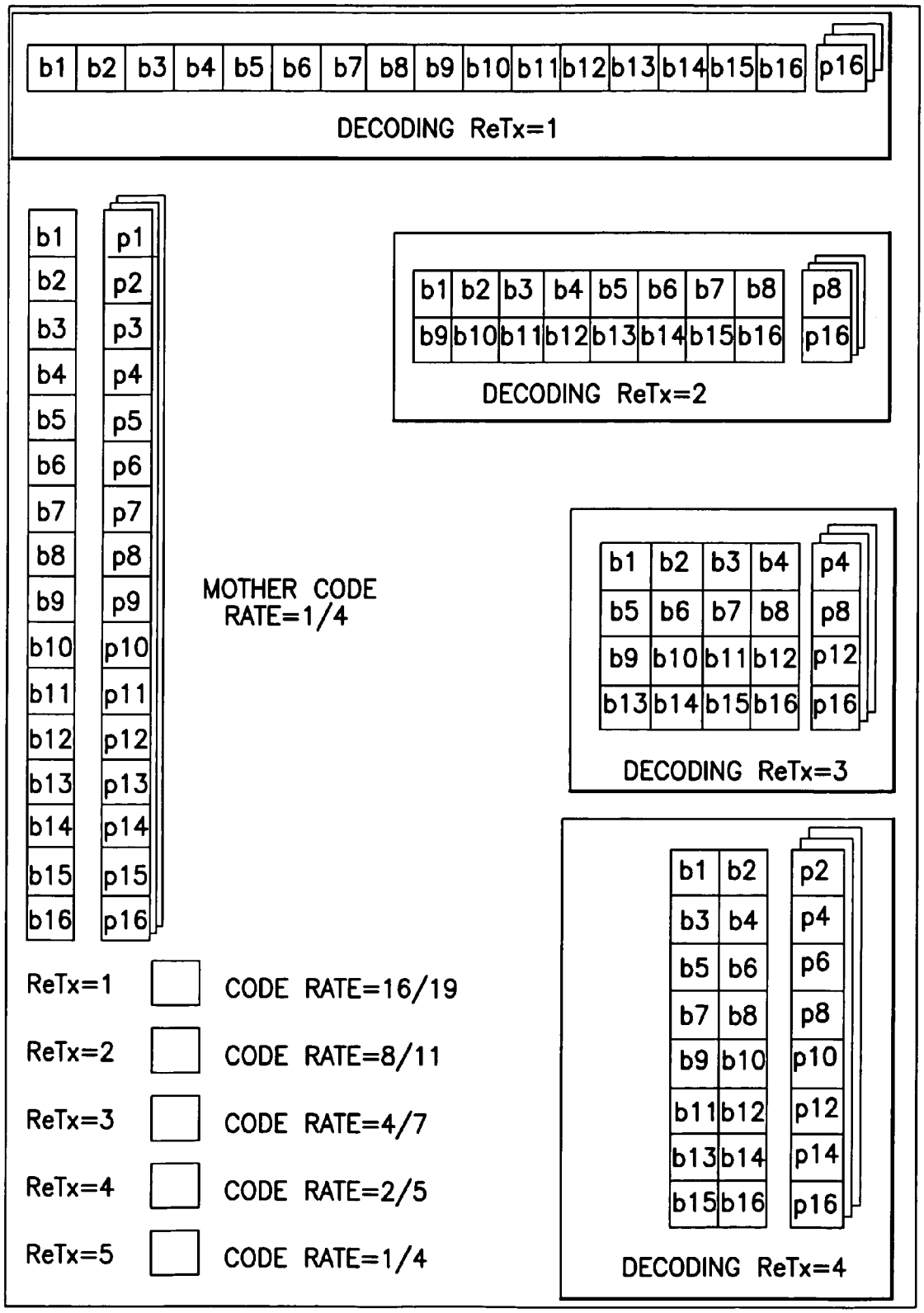
FIG. 5 shows the PCZZ-based HARQ with puncturing rule according to data reshaping in accordance with an aspect of this invention.

As an example, an embodiment of this PCZZ-HARQ technique is presented at FIG. 5 with a rate ¼ mother code PCZZ(16,1,3). For the first transmission ReTx=1, PCZZ(1, 16,3) maybe used with rate R=¹⁶⁄₁₉. Note that since interleaving does not change the last parity bit, in this case it is sufficient to transmit only one parity bit, P16. Each 'layer', shown in FIG. 5 as the parity bits behind one another, represents a different interleave of the K information bits, so the parity bits for any arbitrary I×J matrix of those bits differ except for the final parity bit which is identical among the layers. Parity bits of any particular data layer may be considered a parity bit set, and each data layer forms the K information bits into a matrix. In FIG. 5, each distinct transmission defines the K information bits into an identically dimensioned matrix. As will be shown in FIG. 8, the matrices of different data layers within the same transmission need not be identical. For the second transmission ReTx=2, one may transmit bit P8 and its corresponding bits on the remaining data layers (three parity bits). Specifically, the illustrated parity bits P8 and P16 represent parity for the information bits b1-b8 and b9-16, respectively. Parity bits on other layers of that same ReTx=2 transmission represent parity for eight different information bits, because they are ordered by interleaving the entire K series of information bits differently than those represented by parity bits of other layers within the same transmission. Combined with previously sent data this creates PCZZ(2,8,3) with rate R=8/11. Parity bits P4, P12 and the related parity bits on different layers (which represent different interleaves of the same information bits) may be sent on the third transmission ReTx=3, resulting in PCZZ(4,4,3) with coding rate R=4/7, and so forth.

Figure 6:
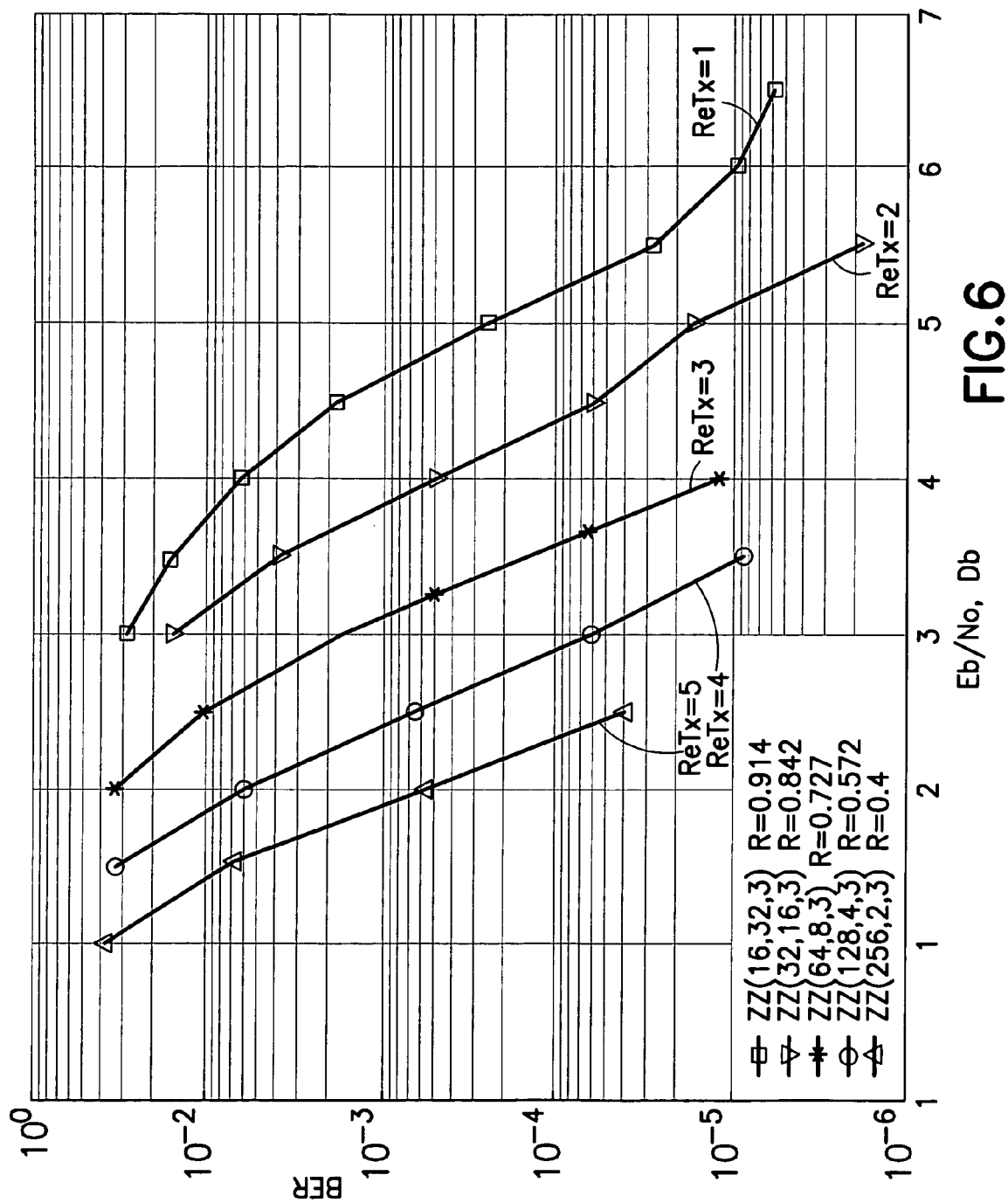
FIG. 6 is a graph showing Bit Error Rate (BER) performance of PCZZ-HARQ with mother code PCZZ(512, 1, 3).
Figure 7:
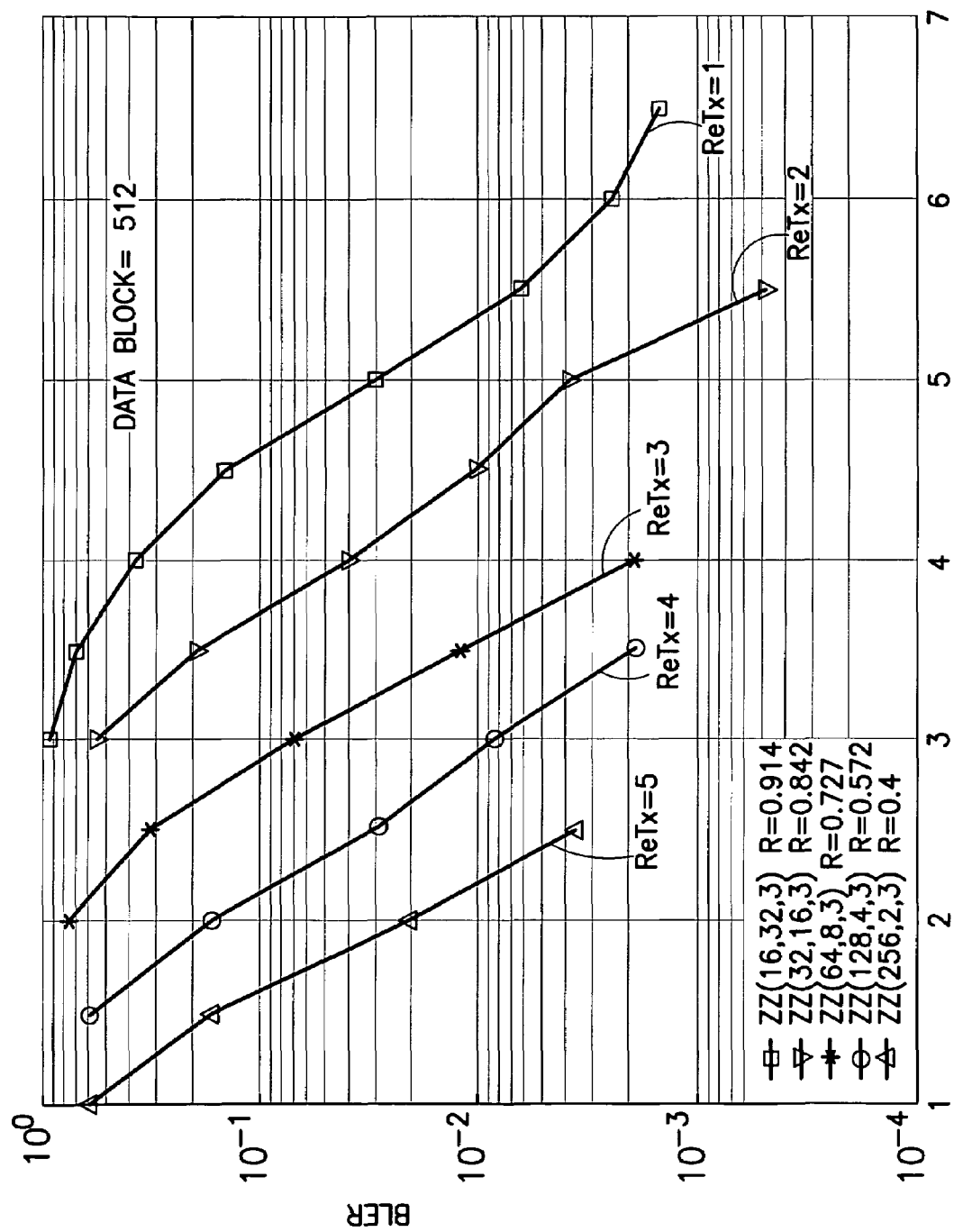
FIG. 7 is a graph showing BLER performance of PCZZ-HARQ with mother code PCZZ(512, 1, 3).

Note that in all cases for decoding one uses the same mother decoder for (16,1,3) either using different decoding parameters I, J (i.e. reshaping) or using depuncturing. BER and BLER performance of PCZZ(512,1,3) with several retransmissions is presented at FIG. 6 and FIG. 7, respectively.

Note that in FIG. 5, the final parity bit P16 in each layer is identical, but all other parity bits (the parity they represent, not necessarily the facial value) are not repetitions of parity bits for the same $I^{th}$ row of the I×J matrix of information bits. Generally, different interleavers are used to simultaneously determine an interleaved series of the K information bits, each interleaver representing one data layer. A puncturing parameter is then used to determine where parity bits should be punctured. For the regular PCZZ codes illustrated in FIG. 5, the puncturing parameter defines a regular periodicity because in each different I×J matrix of a single transmission, there is an equal number of information bits b in each of the I rows of the matrix. While the actual transmission is a series of both information bits b and parity bits P, typically concatenated in some manner, the matrices of FIG. 5 are virtual representations. Knowing the puncturing parameter (e.g., puncture after every $8^{th}$ information bit for ReTx=2; puncture after every $4^{th}$ information bit for ReTx=3, etc.) enables the K information bits to be virtually arranged into the illustrated matrices, because each row terminates with a punctured parity bit. Each subsequent transmission in response to a ARQ for the same underlying data re-shapes the information bits, virtually, as compared to the immediately preceding transmission.

Particularly, consider the first transmission ReTx=1 as an I×J=1×16 matrix of information bits. While it is interleaved three different times, since I=1 there is only one row on each layer with which to associate a parity bit, so P16 is repeated three times (once in each data layer). Responsive to the ARQ from the recipient of ReTx=1, the transmitter then runs the same K information bits through the three interleavers, but uses a puncturing parameter for ReTx=2 with twice the frequency of ReTx=1, so parity bits on different data layers represent parity of different subsets of information bits due to the different interleavers. The information bits in ReTx=2 are arranged in an A×$J_x$=2×8 array, leaving twice the number of rows with which to associate a parity bit. The information bits in ReTx=3 are arranged in a B×$J_y$=4×4 array, and so forth. Since the intended recipient has already received the K information bits in ReTx=1, the transmitter need only respond to the ARQ with the parity bits for each subsequent transmission (e.g., for ReTx=2, ReTx=3, etc).

Note also that the final parity bit P16 remains constant no matter how the data is interleaved. Certain embodiments can dispense with transmitting this final parity bit after ReTx=1 (on one or all data layers) since it provides no further information to the recipient. Note also that while P8 appears to be repeated in both ReTx=2 and ReTx=3, in some embodiments it may not be the identical parity bit. For example, P8 in ReTx=2 represents parity of b1-b8. In ReTx=3, P8 may represent only b5-b8, but the simpler implementation is to have P8 in ReTx=3 represent b1-b8 just as it did in ReTx=2, even though in ReTx=3 the bit P8 terminates only the second row. In either case, P8 is associated (for matrix shaping purposes) only with a single row of the matrix though it represents parity for different subsets of information bits in the differing examples. If the recipient does not already know in advance the puncturing parameter used to generate the parity bits, the transmitter can send it along with the new parity bits that the puncturing parameter was used to generate. As is known in the art, both transmitter and receiver operate with mirror interleaving/de-interleaving patters so the recipient may de-interleave properly.

Consider the following description of the specific examples in FIG. 5, where the information bits b1, b2, ... b16 are to be transmitted as a block, and some of the parity bits p1, p2, ... p16 of the mother code are available for error correction. Both the transmitter and receiver know the mother code, and in some embodiments the transmitter may send a copy of the mother code to the intended recipient at the start of a communications session. There is no need for storing complex puncturing masks in embodiments of this invention. In a first transmission ReTx=1, all information bits are sent in a (virtual) array of dimensions I=1 by J=16, as shown at the top of FIG. 5. The information bits are sent in the first "layer", and one parity bit $p_{16}$ is concatenated following the single row (I=1) of J=16 information bits. Each layer represents the output of one interleaver and encoder. That parity bit p16 is repeated once in each of the M=3 layers in the example of FIG. 5 only because it represents parity for all b1-b16 information bits, so interleaving does not change the parity bit that represents the total of the sixteen information bits. Assuming that the second and third encoders further puncture all the information bits (or generate only the single parity bit p16), the resulting rate is then $$R_1 = \frac{\sum_{i=1}^{I} J_i}{\sum_{m=1}^{M} I_M + \sum_{i=1}^{I} J_i} = \frac{16}{(1+1+1)+(16)} = \frac{16}{19}.$$

Now assume that the intended receiver attempts to decode the rate 16/19 block of data sent as above and shown at the top of FIG. 5, and that the thrice-repeated parity bit p16 is insufficient for proper error control. As this is a hybrid HARQ system, the intended receiver then sends an automatic repeat request to the original transmitting party, whom arranges a second transmission ReTx=2 responsive to that ARQ as shown in FIG. 5. The information bits are re-shaped from the 1×16 matrix of the first transmission ReTx=1 to the 2×8 block shown in FIG. 5 as ReTx=2. Because each of the re-shaped rows still carry only one parity bit, $I_M$ of the preceding rate equation equals 2. To prevent confusion among the differently shaped arrays of information bits, consider I×J as representing the original 1×16 array of FIG. 5; A×$J_x$ as representing the first re-shaped array (ReTx=2 where A=2 and $J_x$=8); B×$J_y$ as representing the second re-shaped array (ReTx=3 where B=4 and $J_y$=4); and C×$J_z$ as representing the third re-shaped array (ReTx=4 where C=8 and $J_z$=2). As detailed above, in any re-shaping of the data array the row length $J_i$ may be allowed to vary, keeping in mind that ΔJ should be constrained within any single re-shaped array to avoid suboptimality. For example, the allowed variance may be constrained to one or two bits to allow fine-tuning of rate, with other rate adjustments deriving from re-shaping on different data layers.

Associated with each of the A=2 rows of the second ReTx=2 transmission ReTx=2 is a single parity bit p8 or p16. A similar pair of parity bits representing the differently-interleaved information bits (from different interleavers) forms the remaining two illustrated data layers. Transmitting the information bits only once among all data layers and not once per layer, the resulting rate for this next transmission is then $$R_2 = \frac{\sum_{i=1}^{l_x} J_i}{\sum_{m=1}^{M} I_{x,M} + \sum_{i=1}^{l_x} J_i} = \frac{16}{(2+2+2)+(16)} = \frac{8}{11}.$$

Figure 2:
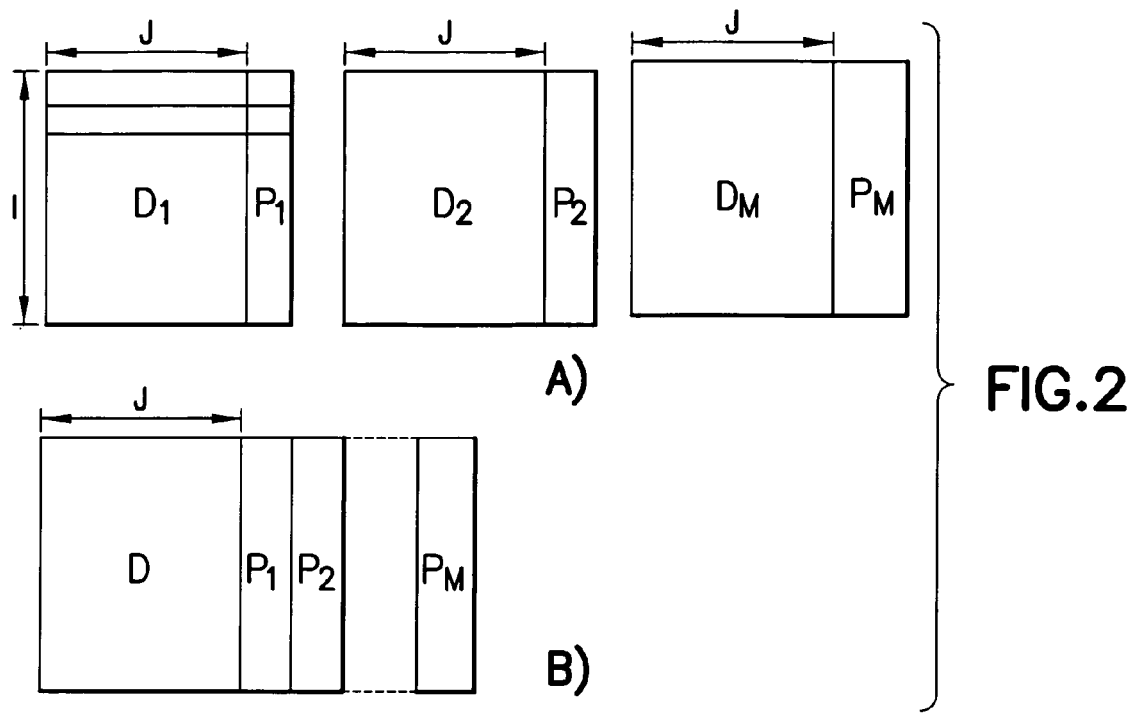
FIG. 2 shows a PCZZ and multi-dimensional single parity check (SPC) code where A) shows the encoding process and B) shows an overall codeword.

The transmitter may send the entire block shown in FIG. 2 as ReTx=2 which includes all parity bits for that block as well as all information bits, it may send only those parity bits newly-generated for that ARQ transmission (six new parity bits as shown in ReTx=2), or it may send only those newly-generated parity bits that are unique and not sent in the original transmission (i.e., eliminating the thrice repeated P16 since P16 never changes). The latter two instances rely on the recipient storing the original block of information bits (and parity bits) for further decoding using the additionally-received parity bits, and is the simplest implementation that maximally conserves bandwidth. In the instance where only the newly-generated parity bits are transmitted, the coding rate for the second transmission taken in isolation is effectively zero since no information bits accompany those additional parity bits, but the effective coding rate is 8/11 as above because the receiver takes the total of all parity bits and the information bits as being one effective block of data. That effective coding rate is represented by the equations presented herein.

Assuming that the recipient again cannot decode the 2×8 array using only parity bits p8 and p16, it then sends another repeat request to the transmitter. The transmitter re-shapes the data as shown in ReTx=3 of FIG. 5 into a 4×4 array, associating one parity bit with each of the four rows and generating different parity bits in each of the three layers due to the different interleaving. The third transmission may be only parity bits as above. The additional parity bits p4 and p12 and their companions in other data layers are thereby provided for decoding, as well as the previously-sent parity bits p8 and p16 and their companion parity bits on the other data layers. The overall coding rate in the third transmission is then $$R_3 = \frac{\sum_{i=1}^{l_y} J_i}{\sum_{m=1}^{M} I_{y,M} + \sum_{i=1}^{l_y} J_i} = \frac{16}{(4+4+4)+(16)} = \frac{4}{7}.$$

The above iterative process is continued as shown for ReTx=4, where C=2 and $J_z$=8 and additional parity bits p2, p6, p10, and p14 are sent along with their companions in the other data layers. The overall coding rate for this fourth transmission is then $$R_4 = \frac{\sum_{i=1}^{l_z} J_i}{\sum_{m=1}^{M} I_{z,M} + \sum_{i=1}^{l_z} J_i} = \frac{16}{(8+8+8)+(16)} = \frac{2}{5}.$$

This fourth transmission punctures only the odd-numbered parity bits of the mother code into the information bits. Each of the above transmissions use less than all parity bits of the mother code. Continuing further according to the same iterative process above would then puncture each information bit of the original 16×1 array with a parity bit of the mother code, achieving a coding rate of ¼ by matching one unique parity bit to one unique informational bit. Since a single bit cannot be interleaved, in this instance the parity bit set on each data layer is identical among any particular row.

Irregular PCZZ

Figures 8A, 8B, 8C:
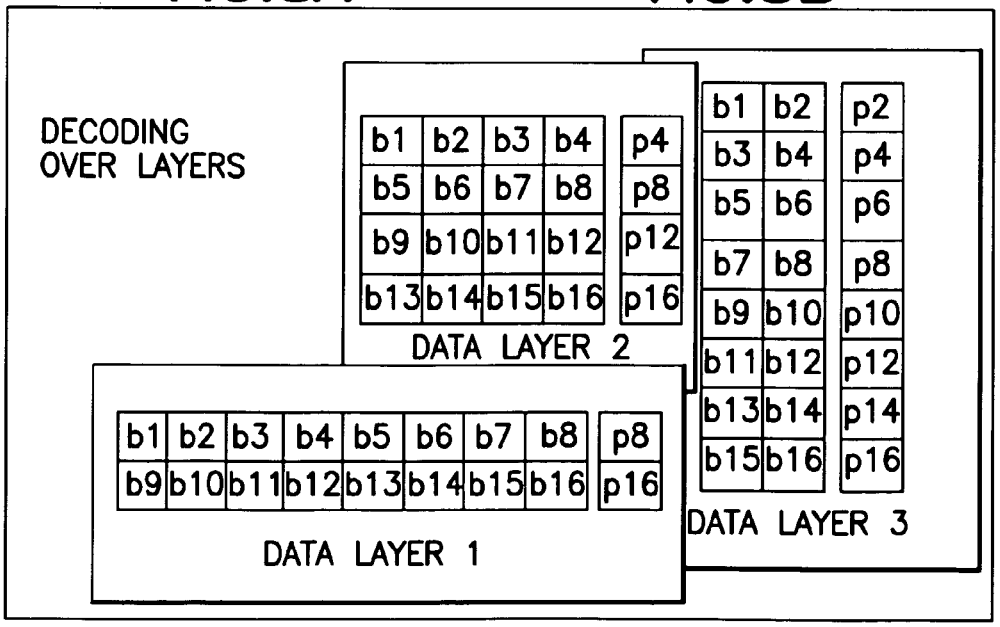
FIG. 8 illustrates irregular PCZZ with reshaping at different data layers.

In the HARQ technique presented above the PCZZ is punctured according to the data reshaping rule, where the punctured bits are the odd-numbered parity bits. This approach enables one to avoid the performance loss due to puncturing, but places certain constraints on the data block length and coding rates. For example, in a general case with the mother code PCZZ(K, 1, 3), the reshaping is based on a factorization of K into integer numbers. A more flexible approach is to allow some irregularity in puncturing (or/and to allow zero padding) as between the data layers. Irregularity among the data layers simply means that the data layers in a particular transmission do not form the same dimensioned virtual matrix. Whereas the regular puncturing of layers in FIG. 5 resulted in the same number of parity bits in each data layer of a particular transmission TeRx=1, 2, 3, or 4, irregular shaping yields different numbers of parity bits in each data layer of the same transmission. The model used to generate the first layer of each different transmission of FIG. 5 is used to generate the different layers of a single transmission in FIG. 8. It is the difference in puncturing among the data layers of a single transmission that is irregular; the puncture sequence for each data layer may or may not be regular (i.e., the row length within a particular matrix may or may not be constant). For example, if length $J_x$, $J_y$ represents the number of information bits in an $I^{th}$ row of a particular matrix, then the irregular layered arrangement of FIG. 8 is maintained whether or not $J_x$ and $J_y$ are allowed to vary or are held constant among all rows of a particular matrix. In FIG. 8C, the row length is held constant.

Figure 9:
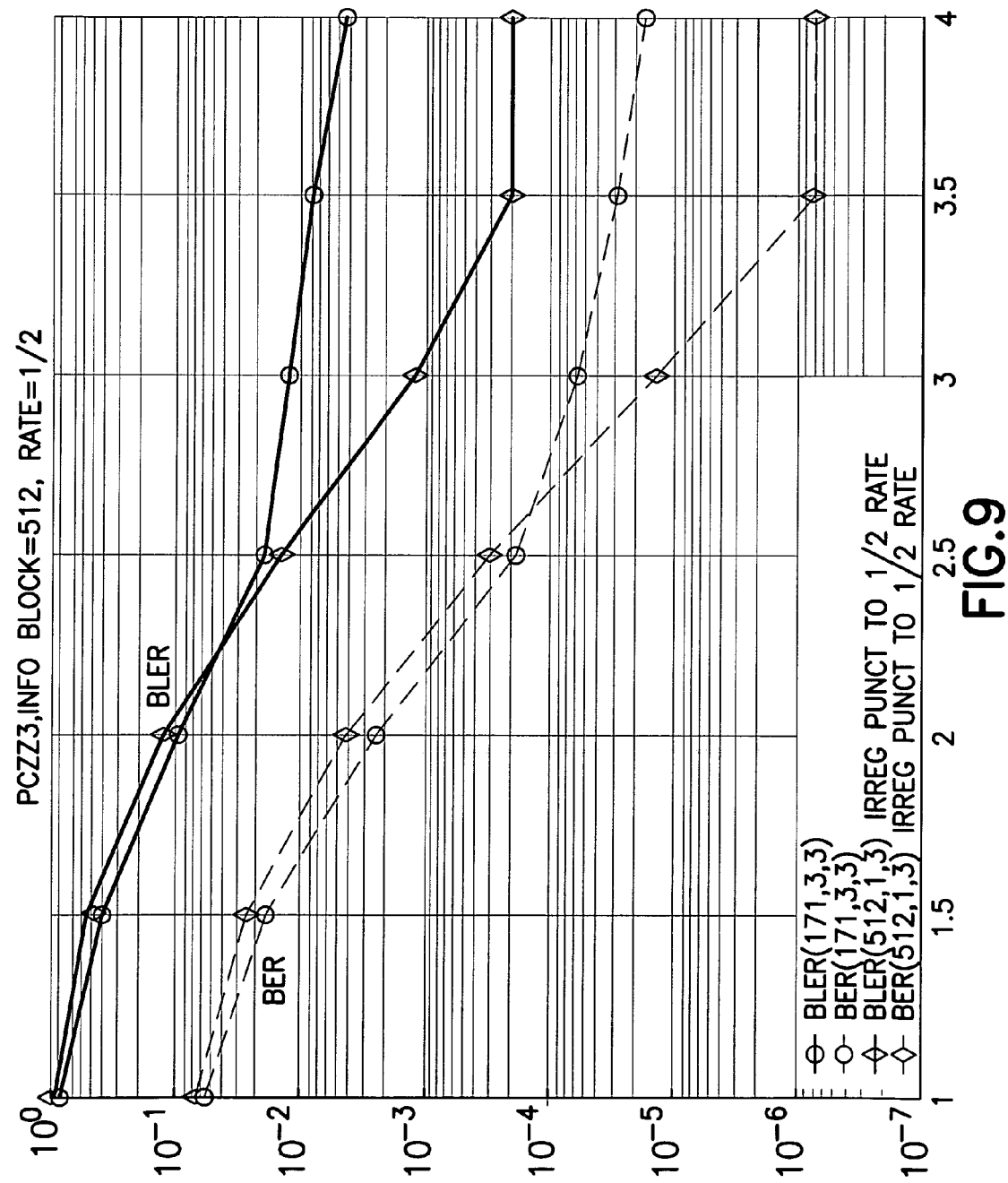
FIG. 9 is a graph showing the performance of regular and irregular PCZZ with rate ½.

As was mentioned above, irregularity within data layers, as in FP_PCZZ where row length within a matrix is allowed to vary, violates the reshaping rule and can result in a noticeable performance degradation. However, using the reshaping principle it is still possible to introduce irregularity among different data layers. An example of irregular PCZZ with different reshaping among data layers is shown in FIG. 8C. The performance of rate ½ irregular PCZZ, where data layers are reshaped differently(128,4)(128,4)(256,2), is presented in FIG. 9. As can be seen, the irregular PCZZ outperforms the ½ rate PCZZ(171,3,3) with equally shaped data layers. Recall that any layer reshaping is mapped back to a certain puncturing. This approach thus facilitates efficient rate matching, where puncturing masks are substantially immune to puncturing sub-optimality. Note that in all cases the same mother decoder is used. With different layers reshaping the resulting coding rate is:

$$R_1 = \frac{K}{K + \sum_{m=1}^{M} I_M}$$

where K=I×J represents the total number of information bits, M represents the total number of data layers (interleavers), and $I_M$ represents the total number of parity bits in each of the $m^{th}$ layer.

To obtain a specific coding rate that is not reachable by only layers reshaping as above, one may also allow for some (minimum) irregularity within a data layer (or layers) that yields a final coding rate:

$$R_1 = \frac{\sum_{i=1}^{I} J_i}{\sum_{m=1}^{M} I_M + \sum_{i=1}^{I} J_i},$$

where I represents the number of rows in the re-shaped array of information bits, and $J_i$ represents the length of the $i^{th}$ row (the number of information bits in that row).

Rate compatible puncturing for HARQ-PCZZ

To obtain rate comparable puncturing for HARQ it is convenient if length K of a data block (assuming the original block is a 1×J array so that the unshaped array exhibits J=K) is divisible by eight. An even more optimum case is if $K=2^n$, which is in general a very natural constraint since in most applications data are in presented in bytes. Then, using irregular PCZZ, rate compatible puncturing masks for re-transmissions may be created from sets of triples: (8,8,8) (8,8,4) (8,4,4) (4,4,4) (4,4,2) (4,2,2) (2,2,2), where puncturing triples $(m_1,m_2,m_3)$ mean that every $m_i$ parity bit from the i-th data layer is transmitted. For example, the puncturing triple (8,8,8) means that puncturing masks for parity bits at all data layers have a periodic structure as (00000001, 00000001, 00000001), i.e., at each data layer every $8^{th}$ parity bit is transmitted. This case corresponds to regular $(I_1=I_2=I_3=I; J_i=J;i=1,\ldots I)$ data reshaping with I=1 rows, J=8 columns and M=3 data layers, resulting in the coding rate:

$$R = \frac{\sum_{i=1}^{I} J_i}{\sum_{m=1}^{M} I_M + \sum_{i=1}^{I} J_i} = \frac{IJ}{MI+IJ} = \frac{J}{M+J} = \frac{8}{11}.$$

This HARQ scheme with regular PCZZ was addressed above. With irregular PCZZ one may provide additional flexibility with data rates. For example, the puncturing triple (8,8,4) means that puncturing masks for parity bits still have the periodic structure, but they are different at different data layers: (00000001, 00000001, 0001). This case corresponds to irregular $(I_1=I_2=I_3/2)$ data reshaping with $J^{(1)}=J^{(2)}=8$ columns at the first two data layers and $J^{(3)}=4$ at the third data layer, resulting in a coding rate R=2/3. Note that for the presented case there is no irregularity within data layers m, i.e., $J^{(m)}_i=J^{(m)}$ and ΔJ=0. Combining the options that the row length $J_i$ may vary with the option that the different layers may produce different numbers of parity bits enables the transmitter to encode at any arbitrary rate.

FIG. 8 illustrates this aspect. In the upper portion is shown the same 1×16 block of information bits $b_1, b_2, \ldots b_{16}$ and the same mother code of parity bits $p_1, p_2, \ldots p_{16}$ as in FIG. 5. The right side of the upper block of FIG. 8 shows the total transmission used to form a code rate of 8/15 by using an (8,4,2) puncturing triple. In the first layer represented by the first column of parity bits $p_8$ and $p_{16}$, a parity bit is punctured after each eight informational bits, representing a virtual 2×8 re-shaped array of the information bits. This is decoded by the receiver as Data Layer 1, shown at the bottom of FIG. 8. The second number of the puncturing triple is four, so the second transmitted layer, illustrated at the second column of parity bits $p_4, p_8, p_{12}$ and $p_{16}$, represents the information bits arranged in a virtual array of 4×4. The receiver decodes the information bits by virtually re-arranging them into the 4×4 array shown in the lower portion of FIG. 8 as Data Layer 2, where each parity bit is associated with a different row of the re-shaped array. The third number of the puncturing triple is eight, so the third transmitted layer, illustrated at the third column of parity bits $p_2, p_4, p_6, p_8, p_{10}, p_{12}, p_{14}$ and $p_{16}$, represents the information bits arranged in a virtual array of 2×8. The receiver decodes the information bits by virtually re-arranging them into the 2×8 array shown in the lower portion of FIG. 8 as Data Layer 3, where each parity bit is associated with a different row of the re-shaped array. Considering that the three columns of parity bits (14 total) are sent in one transmission with the sixteen information bits, the coding rate is then 16/(14+16)=8/15.

Figure 10:
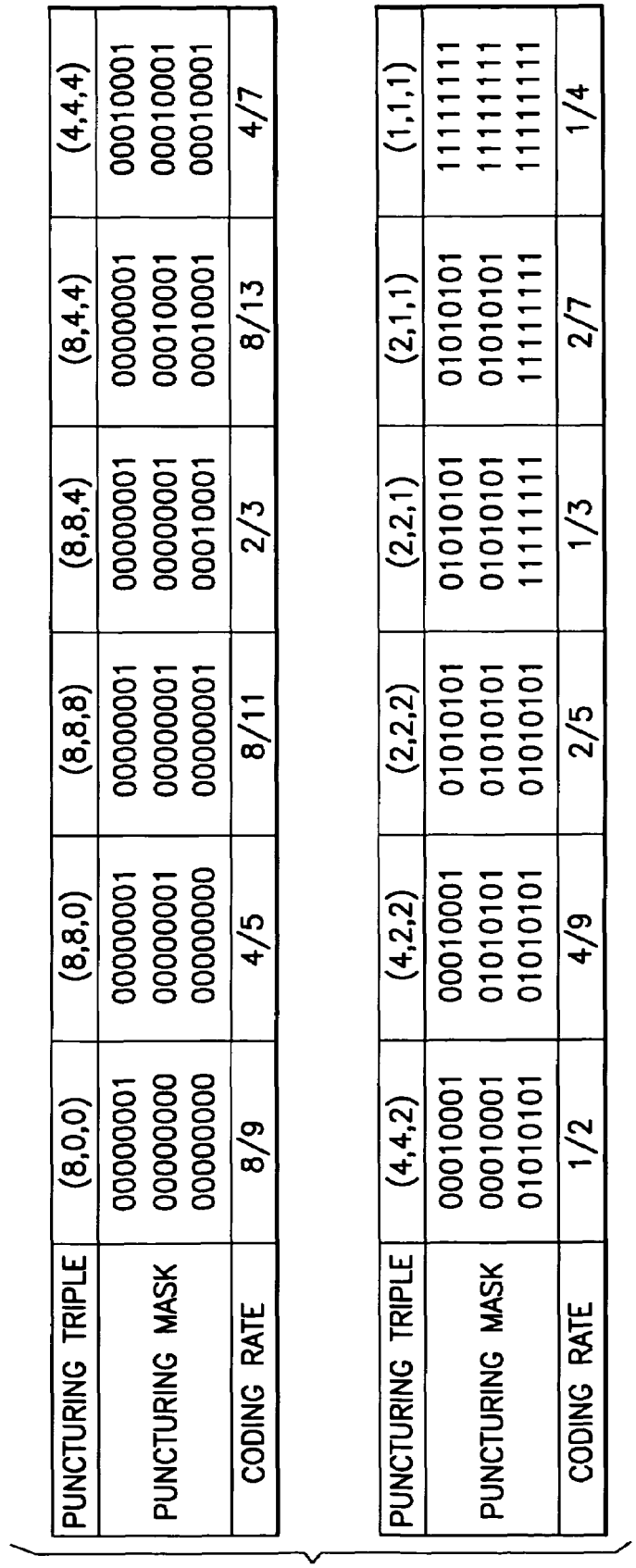
FIG. 10 illustrates non-limiting examples of puncturing triples, masks and coding rates for data blocks divisible by eight.

Non-limiting examples of puncturing masks and coding rates for a data block length divisible by eight are summarized in FIG. 10. Coding rates provided by regular PCZZ are shown in bold (i.e., 8/11; 4/7; 2/5; and 1/4). Note that FIG. 10 does not present all possible rates. For example, coding rate R=8/15 may be provided with puncturing triple (8,4,2) as in FIG. 8. Also, if a data block length is divisible by 16 then coding rates higher than 8/9 may be constructed.

Note that in some cases it is possible to construct both regular and irregular PCZZ to meet required coding rates. However, care should be taken to provide rate compatibility. For example, for coding rate R=1/2 and block data length K=512 it is possible to construct regular PCZZ with parameters (171,3,3). However, this code does not support rate puncturing compatibility, and for this case the punctured irregular PCZZ(512,1,3) with puncturing triple (4,4,2) is preferable.

In some specific cases, when the irregularity among data layers may be sufficient to provide an exact coding rate, some irregularity ΔJ may be allowed within data layers such that ΔJ→min. One non-limiting example of an algorithm first builds an irregular PCZZ as presented above, with a coding rate nearest to the required one, and then allowing some minimum irregularity within one or more data layers (e.g. data layers with the strongest protection).

An advantage to this invention over other PCZZ code schemes is that the same decoders at the receiver for decoding traditional zigzag codes can be used to decode signals of arbitrary coding rates according to the data-shaping teachings of this invention. There is no need to insert known symbols to aid the decoder in decoding, only the puncturing triples or some other puncturing parameter needs be used by the receiver. Implementing this puncturing parameter adds no complexity to the traditional zigzag decoders, while at the same time enabling rate compatibility between transmitter and receiver. That the rates also are arbitrary is a further advantage.

Figure 11:
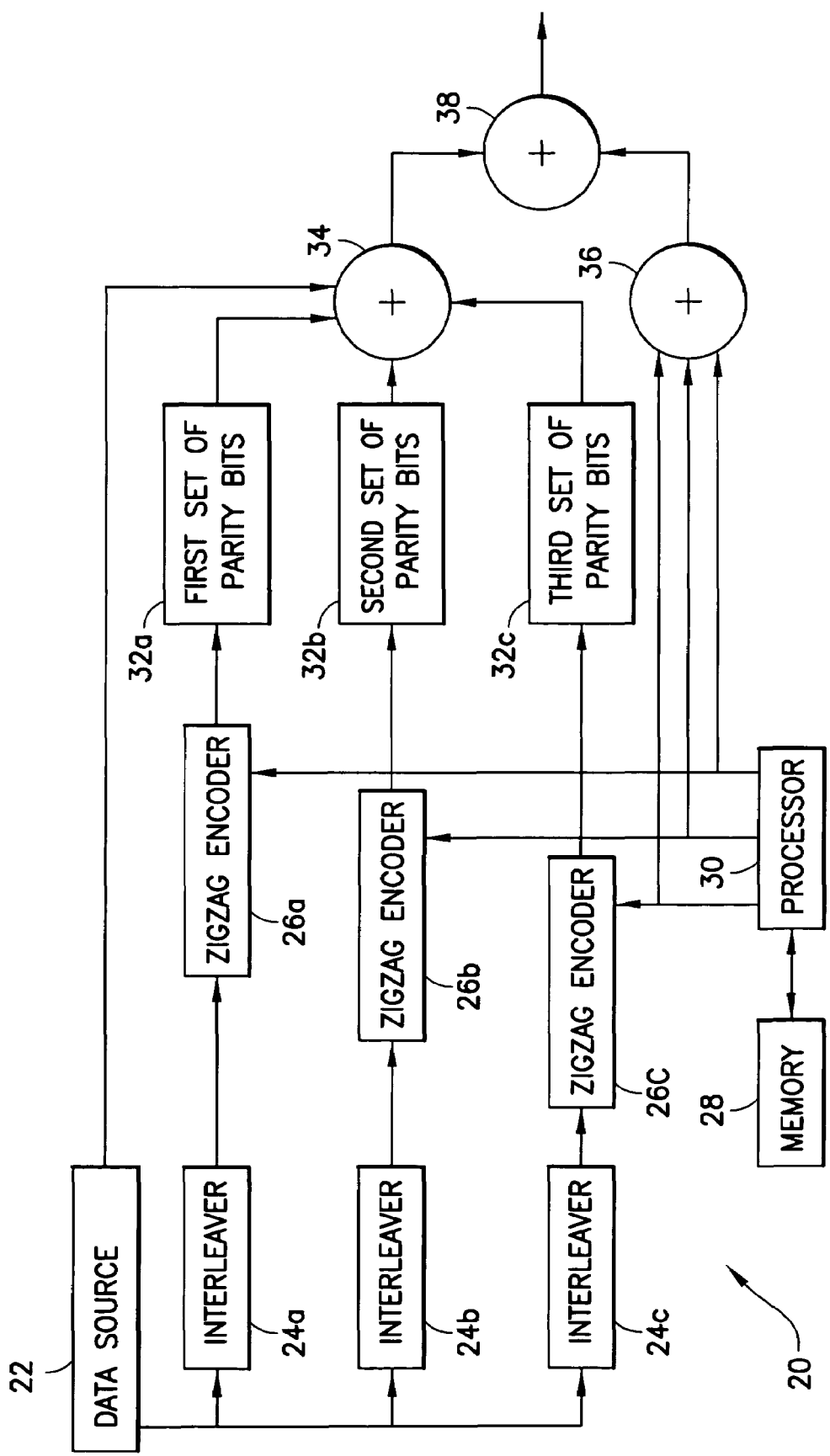
FIG. 11 is a block diagram of relevant portions of a transmitter according to an embodiment of the invention.

An embodiment of relevant portions of a transmitter 20 according to the invention is shown in FIG. 11. A data source 22 provides an input of K information bits into each of three interleavers 24a, 24b, 24c. A first interleaver 24a interleaves the information bits according to a first interleaving pattern and outputs a first interleaved series of information bits. Interleaving patterns are typically stored in the memory 28 and controlled by the processor 30 to enable a single interleaver as hardware to execute different interleaving patterns via software. Typically, 3GPPP stipulates specific interleaving patterns for certain block sizes of data.

Similarly, a second interleaver 24b and a third interleaver 24c interleaves the information bits according to a respective second and third interleaving pattern to output respective second and third interleaved series of information bits. Coupled to an output of the first interleaver 24a is a first zigzag encoder 26a that applies a first puncturing parameter to the first series of interleaved information bits, resulting in a virtual array of I×J information bits with one unique parity bit from a mother zigzag code associated with each row of the I×J array. The mother code and the puncturing parameters are stored in a memory 28, accessed by a processor 30 which directs the first zigzag encoder 26a how to puncture. Similarly for the second 26b and third 26c zigzag encoders using respective second and third puncturing parameters. However, no set of puncturing parameters are identical, so the second puncturing parameter results in a virtual array of A×$J_x$ information bits and the third parameter results in a virtual array of B×$J_y$ information bits as detailed above with respect to FIG. 8 (and as the first layer of the different transmissions of FIG. 5). Output from the first zigzag encoder 26a is a first set of parity bits 32a, and the second 26b and third 26c encoders similarly output respective second 32b and third 32c sets of parity bits. Some may be repeated as detailed above with respect to P16 of FIG. 5, but the different sets are not identical. These different sets of parity bits represent the different data layers as detailed above and particularly in FIGS. 5 and 8. They may be sent with or without the original K information bits, depending upon whether a particular transmission is an original or a reply to an ARQ from the intended recipient.

The three sets of parity bits are combined at a first combiner 34. In some embodiments, the three puncturing parameters (any of these may be more than one single number, as where row length varies within a single virtual array) are combined at a second combiner 36. The outputs of the first 34 and second 36 combiner are then further combined at a third combiner into an encoded block, which is transmitted to an intended recipient, preferably over a wireless channel. Further processing may occur as is known in the art, such as applying headers and tails to packets, applying Walsh and scrambling codes, and the like.

Alternatively, one of the interleavers may be eliminated and only the originally-sequenced series of K information bits may be input directly into one of the zigzag encoders. In another variation, the K information bits may be arranged in a first matrix and interleaved, and the first matrix may also be transposed and then interleaved again by the same interleaver to eliminate the need for one of the interleavers. Such variations are known in the art and functionally equivalent to two interleavers in parallel for at least the basic function of interleaving the same underlying data with different interleave patterns.

The zigzag encoders may be a recursive convolutional code encoder with generative polynomials selected according to 3GPPP standards, or reduced to differential encoders after proper puncturing.

Figure 12:
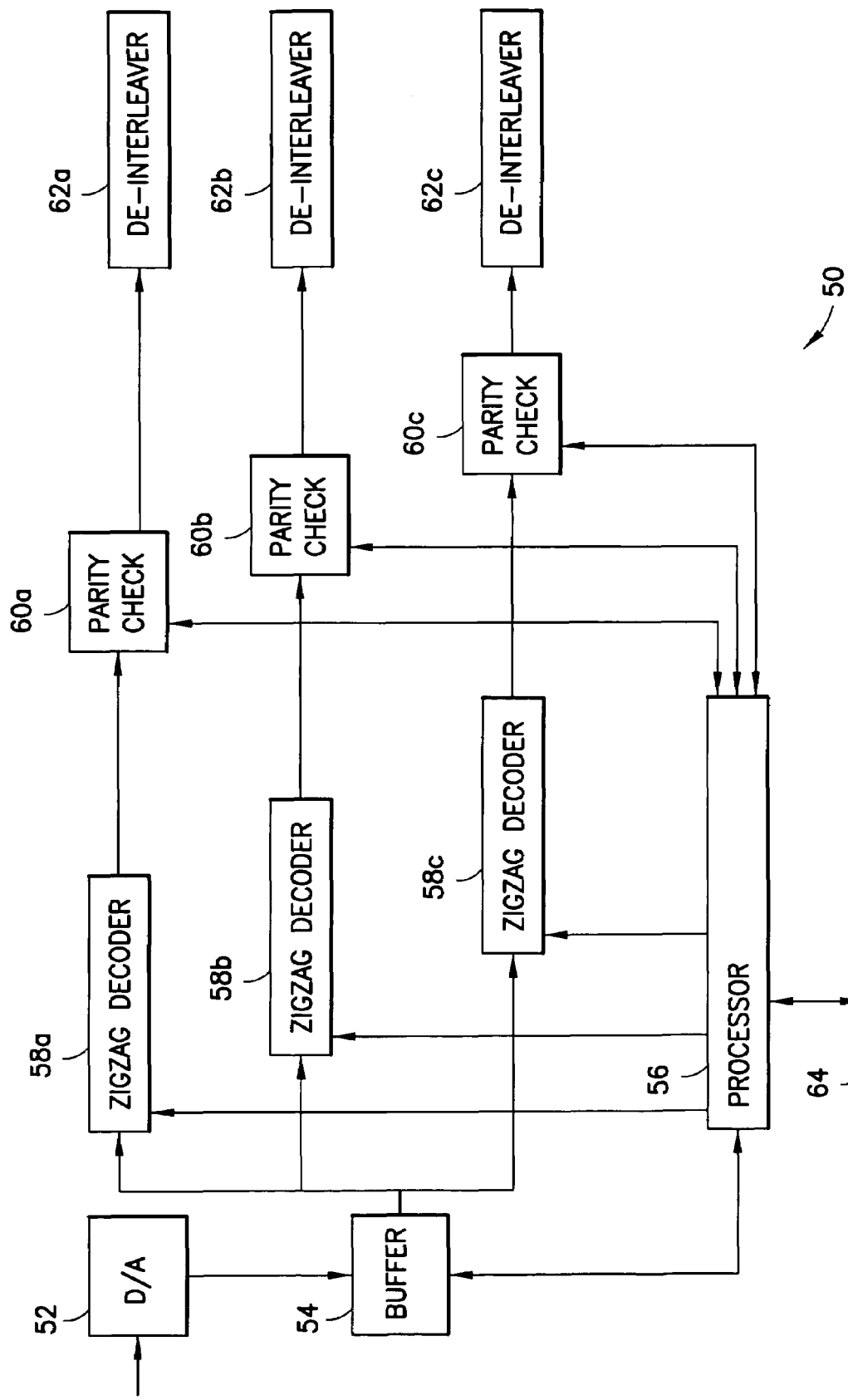
FIG. 12 is a block diagram of relevant portions of a receiver according to an embodiment of the invention.

FIG. 12 illustrates in block diagram form relevant portions of a receiver 50 according to an embodiment of the invention. A signal received over a communications link is converted to digital at a D/A converter 52 and stored in a buffer 54. The signal stored in the buffer 54 includes both the data layers and the puncturing parameters. A processor 56 reads the data in the buffer and determines which is which, typically by positioning within the received message. The processor 56 reads the puncturing parameters and the buffer 54 outputs the data layers to a first zigzag decoder 58a, which applies the first puncturing parameter read by the processor 56 to determine which parity bits are associated with which individual or subsets of information bits, thereby re-constructing virtually the I×J array defined in the transmitter of FIG. 11 by the first zigzag encoder. The first zigzag decoder 58a de-punctures the first set of parity bits, which it knows from its restriction of operating only on the first data layer and from the first puncturing parameter. No complex puncturing masks are required under this invention. A simple comparator 60a compares each parity bit of the first set against those information bits with which it is associated, and if the processor 56 finds error below a threshold, the first de-interleaver 62a de-interleaves the information bits (which are all that is output from the parity check comparator 60a). Similar actions occur of the parallel process lines shown in FIG. 12, using second and third puncture parameters to yield second and third sets of parity bits that are compared and de-punctured. The mother code may be stored in a memory 64 apart from the buffer 54. The decoders 58a-c may use an iterative process, and/or may use intrinsic and/or extrinsic information for decoding. Other decoding, demultiplexing, and de-spreading operations may be carried out in parallel or in series with the operations shown.

One embodiment uses the receiver to instruct the transmitter, during the ARQ message, exactly how to re-shape the data for determining parity bits to send in response to that ARQ. This is particularly efficient as the receiver knows which subsets of information bits did not pass the parity check. One embodiment employs the transmitter to determine an exact data rate, such as one that matches the receiver, and then shape the data to achieve that data rate. As above, this may entail a rough match with equal length rows in each array, followed by fine tuning the rate by varying row length within one or more data levels as necessary to achieve the rate exactly. The receiver may inform the transmitter of an exact rate in the ARQ message. The transmitter and/or receiver may be embodied in a mobile station such as a cellular telephone, a wireless-enabled laptop computer, a PDA with two-way communication capability, and the like. While these teachings are particularly advantageous for wireless communications due to their bandwidth efficiency and rate matching capabilities, the invention is readily operable for communicating over a wired connection also.

The embodiments of this invention may be implemented by computer software executable by a data processor of the transmitter or receiver, or by hardware circuitry, or by a combination of software and hardware circuitry. Further in this regard it should be noted that the various method steps detailed above may represent program steps, or interconnected logic circuits, blocks and functions, or a combination of program steps and logic circuits, blocks and functions for performing the specified tasks.

The design of integrated circuits is by and large a highly automated process. Complex and powerful software tools are available for converting a logic level design into a semiconductor circuit design ready to be etched and formed on a semiconductor substrate. Such programs, such as those provided by Avant! Corporation of Fremont, Calif. and Cadence Design, of San Jose, Calif. automatically route conductors and locate components on a semiconductor chip using well established rules of design as well as huge libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalent puncturing triples, masks and coding rates may be attempted by those skilled in the art. However, all such and similar modifications of the teachings of this invention will still fall within the scope of this invention.

Furthermore, some of the features of the present invention could be used to advantage without the corresponding use of other features. As such, the foregoing description should be considered as merely illustrative of the principles of the present invention, and not in limitation thereof.

What is claimed is:

1. A method for encoding a series of information bits comprising:
    determining a parity bit set for each of a plurality of first transmission data layers, each set comprising at least one bit, and each first transmission data layer representing K information bits interleaved in a different manner as compared to other first transmission data layers and forming a matrix;
    encoding the K information bits with the parity bit set from each first transmission data layer into a first transmission block;
    transmitting the first transmission block to an intended recipient;
responsive to a repeat request from the intended recipient:
    determining an additional set of parity bits for at least one second transmission data layer representing the K information bits forming a matrix of dimensions other than those represented by matrices of the first transmission data layers; and
    transmitting the additional set of parity bits to the intended recipient.

2. The method of claim 1, wherein
    each first transmission data layer forms the K information bits into an identically dimensioned matrix.

3. The method of claim 1, wherein responsive to a repeat request from the intended recipient comprises:
    determining an additional set of parity bits for each of a plurality of second transmission data layers, each second transmission data layer representing K information bits interleaved in a different manner as compared to other second transmission data layers and each second transmission data layer forming a matrix of dimensions different from dimensions of any matrix of the first transmission data layers; and
    transmitting the additional set of parity bits for each of a plurality of second transmission data layers to the intended recipient.

4. The method of claim 3, wherein each of the second transmission data layers form the K information bits into a matrix of dimensions different from matrices of all other second transmission data layers.

5. The method of claim 3, wherein at least one first transmission data layer or at least one second transmission data layer comprises a matrix having rows without an equal number of information bits.

6. The method of claim 5, wherein a variance among the number of information bits among rows within a data layer is constrained to remain within a predetermined non-zero value.

7. The method of claim 1, wherein the parity bit set for each of the plurality of first transmission data layers is determined from a first puncturing parameter and a zigzag mother code, and further wherein the first transmission block comprises the first puncturing parameter.

8. The method of claim 7, wherein the additional set of parity bits for at least one second transmission data layer is determined from a second puncturing parameter and the zigzag mother code, and further wherein transmitting the additional set of parity bits to the intended recipient comprises transmitting the additional set of parity bits and the second puncturing parameter to the intended recipient.

9. The method of claim 1, wherein transmitting the additional set of parity bits to the intended recipient comprises transmitting the K information bits and the additional set of parity bits to the intended recipient.

10. The method of claim 1 wherein each first transmission data layer representing K information bits forming a matrix comprises a matrix of different dimensions as compared to all other first transmission data layers.

11. A transmitter comprising:
    a data source for providing a series of K information bits;
    a first interleaver having an input coupled to an output of the data source for interleaving the series of K information bits according to a first interleaving pattern to yield a first interleaved set of bits;
    a second interleaver in parallel with the first and having an input coupled to an output of the data source for interleaving the series of K information bits according to a second interleaving pattern to yield a second interleaved set of bits;
    a first zigzag encoder, having an input coupled to an output of the first interleaver, for puncturing the first interleaved set of bits with a first set of parity bits from a mother code such that the first set of parity bits shapes the first interleaved set of bits into a first data layer matrix;
    a second zigzag encoder, having an input coupled to an output of the second interleaver, for puncturing the second interleaved set of bits with a second set of parity bits from the mother code such that the second set of parity bits shapes the second interleaved set of bits into a second data layer matrix;
    a memory for storing the mother code;
    a processor coupling the memory to the first and second zigzag encoders for controlling the zigzag encoders; and
    at least one transmit antenna for wirelessly sending the K information bits and the first and second sets of parity bits in a block;
    wherein the processor further operates to cause the first zigzag encoder to puncture a repeated first interleaved set of bits with a third set of parity bits from the mother code such that the third set of parity bits shapes the repeated first interleaved set of bits into a third data layer matrix that has dimensions different from either the first or second data layer matrix, and the antenna is further for transmitting the third set of parity bits.

12. The transmitter of claim 11, wherein the first and second data layer matrices are of the same dimensions.

13. The transmitter of claim 11, wherein the first and second data layer matrices define different dimensions.

14. The transmitter of claim 11, wherein at least one of the first, second, or third data layer matrices comprise a matrix having rows without an equal number of information bits.

15. The transmitter of claim 14, wherein a variance among the number of information bits among rows within the data layer matrix is constrained to remain within a predetermined value.

16. The transmitter of claim 11, wherein the first zigzag encoder punctures the first interleaved set of bits according to a first puncturing parameter, and the block comprises the first puncturing parameter.

17. The transmitter of claim 16, wherein the processor further operates to cause the first zigzag encoder to puncture the repeated first interleaved set of bits according to a second puncturing parameter, and the antenna is further for transmitting the third set of parity bits with the second puncturing parameter.

18. The transmitter of claim 11, wherein the antenna is further for transmitting the third set of parity bits with the K information bits in a second block.

19. The transmitter of claim 11, wherein the processor further operates to cause the second zigzag encoder to puncture a repeated second interleaved set of bits with a fourth set of parity bits from the mother code such that the fourth set of parity bits shapes the repeated second interleaved set of bits into a fourth data layer matrix that has dimensions different from either the first or second data layer matrix, and the antenna is further for transmitting the third and fourth sets of parity bits.

20. The transmitter of claim 19 wherein the third and fourth data layer matrices are of different dimensions.

21. A program of machine-readable instructions, tangibly embodied on an information bearing medium and executable by a digital data processor, to perform actions directed toward encoding a series of information bits, the actions comprising:
    determining a parity bit set for each of a plurality of a first set of data layers, each set comprising at least one bit, and each data layer of the first set of data layers representing K information bits interleaved in a different manner as compared to others of the first set of data layers and each of the first set of data layers forming a matrix of the K information bits;
    determining an additional set of parity bits for at least one second data layer representing the K information bits forming a matrix of dimensions other than those represented by matrices of the first set of data layers.

22. The program of claim 21, the actions further comprising encoding the K information bits with the parity bit sets of the first data layers into a block for transmission.

23. The program of claim 21, wherein the parity bit set for each of the first set of data layers and the additional set of parity bits for the at least one second data layer is determined from a set of puncturing parameters.

24. The program of claim 21, wherein each matrix of the first set of data layers defines the same dimensions.

25. The program of claim 21, wherein each matrix of the first set of data layers defines different dimensions as compared to all other matrices of the first set of data layers.

26. The program of claim 21, wherein at least one matrix of the first set of data layers, or of the at least one second data layer, comprises a number of information bits that is not constant among all rows of the said at least one matrix.

27. The program of claim 26, wherein a variance among all row lengths of the said at least one matrix is constrained to remain within a predetermined nonzero value.

28. The program of claim 21, wherein determining an additional set of parity bits for at least one second data layer comprises:
    determining an additional set of parity bits for a plurality of data layers of a second set, each of the plurality of data layers of the second set representing the K information bits forming a matrix of dimensions other than those represented by matrices of the first set of data layers.

29. The program of claim 28, wherein each of the plurality of data layers of the second set forms a matrix of like dimensions.

30. The program of claim 28, wherein each of the plurality of data layers of the second set forms a matrix of different dimensions, each of said different dimensions being further different from dimensions of any matrix of the first set of data layers.

31. A receiver comprising:
    an antenna for receiving an encoded signal that includes both information bits and parity bits;
    a first zigzag decoder having an input coupled to an output of the antenna for de-puncturing a first set of parity bits from the encoded signal according to a first puncturing parameter, wherein the first set shapes the information bits into a first array of dimensions I×J;
    a first comparator having an input coupled to an output of the first zigzag decoder for checking parity of each of the I rows of the first array against a parity bit of the first set;
    a first de-interleaver having an input coupled to an output of the first zigzag decoder for de-interleaving the information bits that are output from the first zigzag decoder;
    a second zigzag decoder in parallel with the first zigzag decoder and having an input coupled to an output of the antenna for de-puncturing a second set of parity bits from the encoded signal according to a second puncturing parameter, wherein the second set shapes the information bits into a second array of dimensions A×$J_x$ such that A is greater than I;
    a second comparator having an input coupled to an output of the second zigzag decoder for checking parity of each of the A rows of the second array against a parity bit of the second set;
    a second de-interleaver having an input coupled to an output of the second zigzag decoder for de-interleaving the information bits that are output from the second zigzag decoder;
    a memory for storing a zigzag mother code, wherein the first and second sets of parity bits are each subsets of the mother code; and
    a processor coupled to the first and second zigzag decoders and to the memory for providing said first and second puncturing parameters to said respective first and second zigzag decoders.

32. The receiver of claim 31, further comprising:
    a third zigzag decoder in parallel with the first zigzag decoder and having an input coupled to an output of the antenna for de-puncturing a third set of parity bits from the encoded signal according to a third puncturing parameter, wherein the third set shapes the information bits into a third array of dimensions B×$J_y$ such that B is greater than A;
    a third comparator having an input coupled to an output of the third zigzag decoder for checking parity of each of the B rows of the third array against a parity bit of the third set;
    a third de-interleaver having an input coupled to an output of the third zigzag decoder for de-interleaving the information bits that are output from the third zigzag decoder;

and wherein the third set of parity bits is a subsets of the mother code and wherein the processor is further coupled to the third zigzag decoder for providing said third puncturing parameter to said third zigzag decoder.

33. The receiver of claim 31 further comprising a transmitter coupled to the processor and the antenna for sending an automatic repeat request ARQ that includes information about a data rate at which a reply to the ARQ should be sent.

34. The receiver of claim 33, wherein the data rate substantially matches that of the encoded signal.

35. The receiver of claim 33, wherein the information about a data rate comprises the first and second puncturing parameters.

36. A transmitter comprising:
means for storing a zigzag mother code;
means for predetermining a preferred data rate;
means for shaping K information bits into a plurality of arrays by determining a parity bit for each row of each array, such that at least two arrays of the plurality defines a number of rows different from one another and the total number of parity bits encodes the K information bits at substantially the preferred data rate.

37. The transmitter of claim 36, wherein
the means for storing a zigzag mother code comprises a computer readable storage medium;
the means for predetermining a preferred data rate comprises a receiver for receiving an automatic repeat request message that carries information about the preferred data rate;
the means for shaping comprises a first interleaver in series with a first zigzag encoder, a second interleaver in series with a second zigzag encoder, and a processor coupled to each zigzag encoder for applying a data-shaping algorithm for shaping the K information bits into the plurality of arrays.

38. The transmitter of claim 37 wherein the means for shaping further comprises a third interleaver in series with a third zigzag encoder.

39. The transmitter of claim 37, wherein the data-shaping algorithm shapes one of the plurality of arrays such that a variation in a number of information bits among all rows of said one of the plurality of arrays is constrained to remain within a non-zero value.

* * * * *